Dec. 3, 1968 G. A. HELLWARTH 3,414,830
ELECTRICAL AMPLIFIER
Filed July 21, 1965
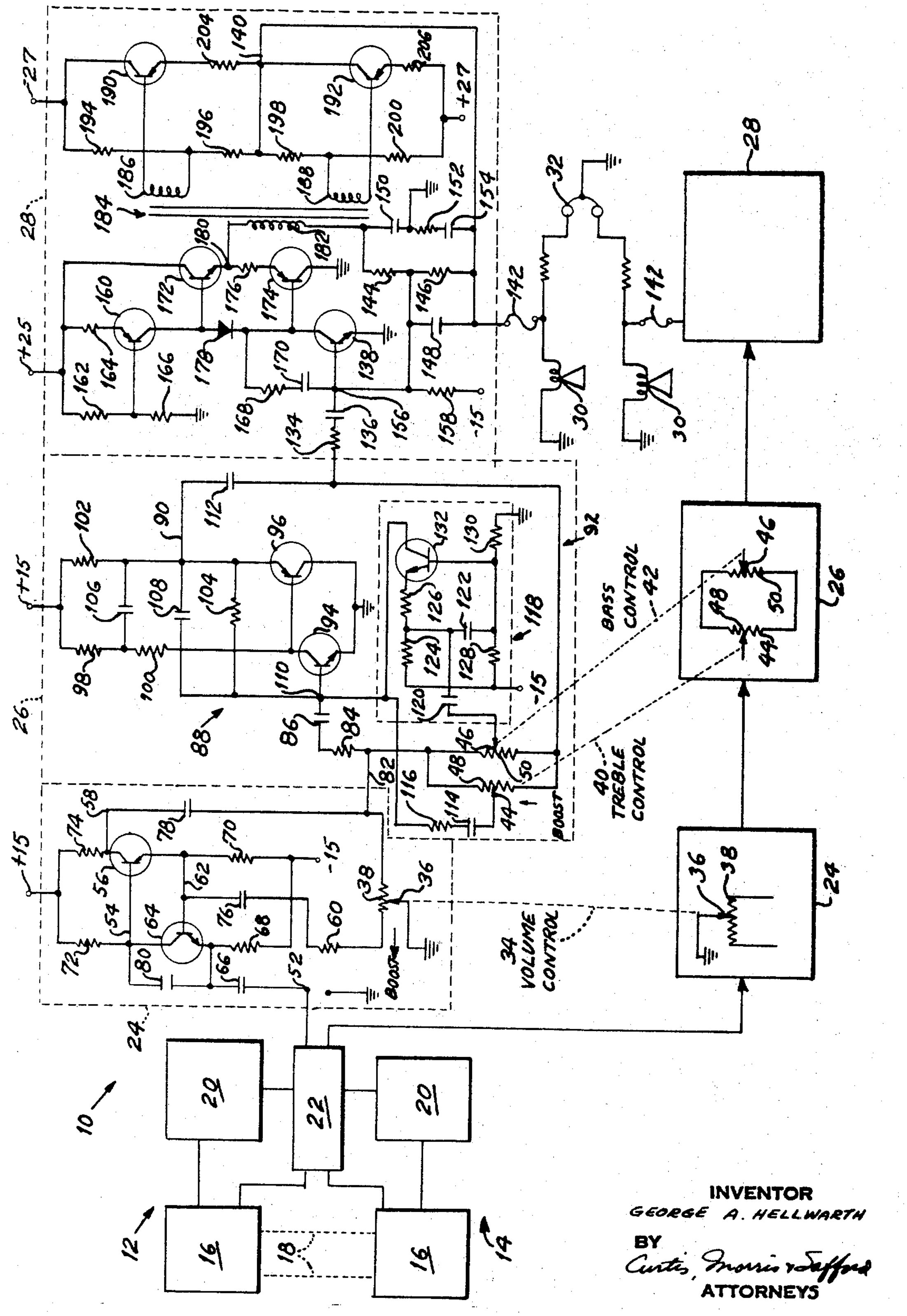
INVENTOR
GEORGE A. HELLWARTH
BY
ATTORNEYS United States Patent Office 3,414,830

Patented Dec. 3, 1968

3,414,830
ELECTRICAL AMPLIFIER
George A. Hellwarth, 3 Highpoint Drive,
Poughkeepsie, N.Y. 12603
Filed July 21, 1965, Ser. No. 473,585
9 Claims. (Cl. 330—15)

This invention relates to electrical amplifiers; more particularly, the present invention relates to electrical amplifiers for amplifying electrical signals to be converted into audible sound signals. In its preferred embodiment, the present invention is used in a "stereophonic high-fidelity" amplifier.

A major object of the present invention is to provide an all "solid-state" high-fidelity amplifier; that is, a high-fidelity amplifier whose active components are all semiconductors or other solid components and which uses no vacuum tubes. More specifically, it is a major object of the present invention to provide a high-quality, high-performance solid-state amplifier which is relatively low in cost.

A number of problems long have confronted the high-fidelity amplifier art. One persistent problem has been that when the amplifier is adjusted to produce a relatively low volume output, the electrical "noise" produced by the amplifier is of a magnitude comparable to that of the signal being amplified with the result that a considerable amount of static-like disturbances are heard by the listener. It is one object of the present invention to provide a solid-state high-fidelity amplifier which produces no noticeable "noise" disturbance at low volume output levels.

It long has been common to provide two separate controls ("bass" and "treble" controls) for separately controlling the amplification of low frequency and high frequency signals. It also has been desired to provide symmetrical increase or decrease ("boost" or "cut") of amplification in both the bass and treble controls. In the past, the variation in boost and cut has been very asymmetric; that is, the boost or cut of the bass control varies with frequency and with control knob setting in a manner substantially different from the variation of the boost or cut in the treble control. Accordingly, it is another object of the present invention to provide a solid-state high-fidelity amplifier having symmetric bass and treble boost and cut control arrangements. Another object of the invention is to provide such a tone control circuit which has relatively inexpensive components and is relatively simple and inexpensive to manufacture.

Another long-recognized need is for a solid-state high-fidelity amplifier in which the active circuit elements at the output of the amplifier are transistors. However, such an arrangement has been extremely difficult and expensive to achieve in practice. In most prior solid-state amplifiers, the expensive output transistors have a great tendency to be destroyed by either an undesired or too large a signal input to the amplifier, or by acidentally short-circuiting the output terminals of the amplifier. Solutions for this problem provided by the prior art generally have proved to be unsatisfactory, with the result that a fully satisfactory solution to this problem has been the subject of intensive research and development in the high-fidelity amplifier art. Therefore, it is an object of this invention to provide a truly practical and relatively inexpensive solid-state high-fidelity amplifier with transistor output elements which are protected from damage or destruction due to instantaneous or long-term overloads or short circuits, without degradation of amplifier performance.

It is yet another object of this invention to provide such an amplifier which is insensitive to extremes of ambient temperature, power supply voltage fluctuations, or unusual input signals. Furthermore, it is an object of this invention to produce such an amplifier which has extremely low output distortion and noise, and otherwise gives superior performance and yet is economical to manufacture.

OVERALL AMPLIFIER

The drawing is a schematic circuit diagram of the preferred embodiment of the amplifier of the present invention. The amplifier 10 shown in the drawing is a stereophonic high-fidelity amplifier having two identical amplifier channels 12 and 14. Each channel includes an input selector circuit 16 which typically includes a knob which can be set to a preselected position to adapt the equipment to receive input signals from any of several types of input devices, such as phonographs, tape recorders, radio receivers, or the like. The dashed line 18 indicates that a single knob is turned to simultaneously adjust both of the circuits 16 in both of the stereophonic channels.

Each selector circuit 16 is connected to a preamplified and equalizer circuit 20, and circuits 16 and 20 are interconnected by a control circuit 22 which provides such functions as tape monitoring (for reproducing sound being recorded on a tape recorder); selection between stereophonic and monaural (single channel) operation, and adjusting the proportion of volume produced by the two channels relative to one another ("balance" control).

Circuits 16, 20 and 22 may be any of a number of well known circuits. A preferred and particularly advantageous pre-amplifier circuit 20 is disclosed in my co-pending U.S. patent application Ser. No. 339,124, filed June 21, 1964.

The pre-amplified signal is conducted from each pre-amplifier 20 to a volume control circuit 24, then to a tone-control circuit 26, then to a power amplifier 28, and finally to a loud speaker 30 which audibly reproduces the sound desired. A pair of earphones 32 is connected between the power amplifiers 28 of each channel 12 and 14 so that the sound reproduced by each channel is reproduced in one of the earphones.

A single volume control knob, indicated schematically at 34, varies the setting of wiper arms 36 of identical volume control potentiometers 38 in both channels 12 and 14. Similarly, a single treble control knob 40 and a bass control knob 42 vary the settings of wiper arms 44 and 46 of identical treble and bass control potentiometers 48 and 50, respectively. It will be understood, of course, that when monaural operation is selected, only one of the amplifier channels 12 or 14 is operative and sound is produced by only one of the loud speakers 30.

VOLUME CONTROL CIRCUIT 24

Volume control circuit 24 is somewhat similar to the circuit described in my co-pending U.S. patent application Ser. No. 320,376, filed Oct. 31, 1963. The present circuit 24 constitutes an improvement over the circuit shown in that patent application.

The pre-amplified electrical signal is conducted to one input terminal 52 of volume control circuit 24, from which point it is conducted to the base electrode of a common-emitter-connected transistor 56. An output lead wire 58 is connected to the collector of transistor 56 and provides amplified output signal of circuit 24.

One end terminal of volume control potentiometer 38 is connected to output lead 58, and the other end of potentiometer 38 is connected through a gain-limiting resistor 60 to the base electrode 62 of a common-base-connected feedback transistor 64. The collector of transistor 64 is connected to the base of transistor 56, and its base is connected to the emitter of transistor 56.

Potentiometer 38, resistor 60 and transistor 64 are components of a negative feedback network which provides a variable amount of negative feedback for the volume amplification circuit. The potentiometer 38 is used in a unique way. The portion of potentiometer 38 which is to the right of the wiper 36 serves as a variable load resistor for the volume amplifier whereas the portion to the left of wiper 36 serves as a feedback resistor supplying a feedback voltage to the volume amplifier. When the setting of wiper 36 is varied, both the amplifier load impedance and the feedback voltage are varied in a complementary manner; that is, when the wiper is moved to the left, the load impedance increases and the feedback voltage decreases. This simultaneously increases the voltage gain of circuit 24 both due to the reduction in feedback voltage and due to increased load impedance. Similarly, when the wiper 36 is moved to the right, the load impedance decreases as the feedback voltage increases, thus decreasing the gain of circuit 24.

In accordance with one feature of the present invention, the transistor 64 amplifies the feedback signal and the input signal, and greatly reduces distortion that otherwise might be present. The input signal passes from terminal 52 through a relatively large coupling capacitor 66 to the emitter of transistor 64 and through the emitter-collector path of transistor 64 to the base 54 of transistor 56. Positive and negative DC (15 volt) bias supplies are provided, together with bias resistors 66, 70, 72 and 74 to bias transistors 56 and 64 into conduction. Relatively large coupling capacitors 76 and 78 isolate this DC bias network and prevent it from influencing the AC operation of the circuit. A relatively small capacitor 80 is connected between the emitter and collector of transistor 64 to provide high-frequency stability (i.e., freedom from oscillation) in the circuit.

The standard, well known equation relating the output voltage to the input voltage of a circuit with feedback is set forth below:

$$\frac{Eo}{Ei}=\frac{A}{1+AB} \tag{1}$$

in which:

A is the circuit voltage gain without feedback;
B is the fraction of output voltage fed back; and
*Eo/Ei* is the circuit voltage gain with feedback.

It can be seen from Equation 1 that if the quantity AB can be made much greater than one, the circuit voltage gain will be approximately equal to $1/B$. Since the factor B is determined by linear circuit elements (resistors) in circuit 24, if the quantity AB is very large, the voltage gain of the circuit will be substantially independent from the gain A of the amplifier without feedback. Since it is the non-linear variation of A that is the major cause of distortion, making the product AB very large thus substantially eliminates the distortion which otherwise might occur. The addition of transistor 64 increases A to a degree such that the quantity AB is very much greater than 1 and distortion is substantially eliminated.

The circuit arrangement connecting transistor 64 into the circuit 24 is novel and advantageous. It provides an increased gain A for the circuit without requiring additional coupling capacitors or resistors which otherwise would be required for connecting another amplification stage in the circuit. Thus, the circuit is simple, inexpensive, and easy to manufacture.

Another significant advantage of volume control circuit 24 is that it has a consistently high signal-to-noise ratio; that is, the signal-to-noise ratio of circuit 24 is high at both low and high-volume settings. Thus, in contrast to most prior art control circuits, there is produced no noticeable audible noise at low volume settings.

This circuit arrangement provides further advantage in that relatively inexpensive unregulated power supply system can be used to supply circuit 24 without the introduction of noise.

Circuit 24 has an additional advantage when used in connection with the tone control circuit 26; this combination produces an automatic "loudness" control which will be described in greater detail below.

TONE CONTROL CIRCUIT 26

The amplified signal from volume control circuit 24 is conducted through an input lead 82, an input resistor 84, and a relatively large coupling capacitor 86 to an amplifier circuit indicated at 88. An amplified output signal is produced on output lead 90, and a feedback network, indicated generally at 92, is provided and connected to the amplifier 88 to form an "operational" amplifier configuration.

Equation 2 sets forth the well-known relationship between the voltage gain of an operational amplifier having a very large voltage gain without feedback:

$$\frac{Eo}{Ei}\cong-\frac{Rf}{Ri} \tag{2}$$

in which:

*Eo/Ei* is the circuit voltage gain with feedback;
R*i* is the total input resistance of the circuit; and
R*f* is the total resistance in the feedback loop.

Thus, from the foregoing equation, the voltage gain of the operational amplifier is approximately equal to the ratio of the feedback resistance to the input resistance; the negative sign for this gain indicates that the amplifier provides an "inverting" or polarity-reversing function.

The inverting amplifier 88 includes two transistors 94 and 96 of complementary type connected in cascade to one another in common-emitter and common-collector connections, respectively. Appropriate supplies of positive and negative DC bias voltage are provided, together with bias resistors 98, 100, 102 and 104. Amplifier 88 has a high voltage gain and performs an inverting function.

A positive feedback signal is supplied from transistor 96 to transistor 94 by means of a capacitor 106. Capacitor 106 provides, in combination with resistors 98 and 100, a "bootstrap" network which counteracts the loading and gain-reducing effects of resistances 98 and 100 and maintains the gain of amplifier 88 at a high level.

There are two negative feedback loops connected between the output lead 90 and the input lead 110 of amplifier 88. One such negative feedback path is provided by the parallel combination of resistor 104 and a relatively small capacitor 108 which is provided to prevent oscillation at high frequencies and thus improve circuit stability. The value of resistor 104 advantageously is identical to that of the input resistor 84 so as to provide an overall circuit gain of one for signals having a frequency in the middle of the spectrum of frequencies amplified by the amplifier 10; i.e., so as to provide unity gain at "midband" frequencies.

The other negative feedback path is from output lead 90 through a relatively large coupling capacitor 112 to the lower end of potentiometers 48 and 50, then either through wiper 44 of potentiometer 48, through a capacitor 114 and resistor 116 to the input terminal 110 of amplifier 88, or through wiper 46 of potentiometer 50, through an "electronic inductor" circuit indicated at 118, and then to input terminal 110.

The series combination of capacitor 114 and resistor 116 comprises a "high-pass" filter network which presents relatively low impedance to high frequency negative feedback signals but a relatively high impedance to midband and low frequency feedback signals. Conversely, electronic inductor circuit 118 provides an impedance which varies in substantially the same way as the absolute value of the impedance of an iron-core inductor. That is, circuit 118 presents a low impedance to low frequency signals, but a relatively high impedance to midband and high frequency signals.

The operation of circuit 26 will be explained first in its operation with respect to signals at midband frequency, then at high frequencies, and finally at low frequencies.

With respect to signals of midband frequency, the filter networks connected to the wipers of potentiometers 48 and 50 present a very high impedance. The effect of this is to substantially remove potentiometers 48 and 50 from the circuit. Thus, with respect to midband frequency signals, the total feedback resistance is that of resistor 104, and the total input resistance is merely the resistance of resistor 84. Since the resistance of resistors 84 and 104 is equal, the circuit gain with respect to midband frequency is unity (1.0).

With respect to relatively high frequency signals, circuit 118 presents a very high impedance. However, the combination of capacitor 114 and resistance 116 has a low impedance. Thus, the wiper 44 of potentiometer 48 is connected through a very low impedance to the input terminal 110. The resistance of each potentiometer 48 and 50 is made approximately twice that of resistors 104 and 84. Thus, with wiper 44 set in the center of potentiometer 48, the total input resistance $R_i$ is equal to the parallel combination of the upper half of potentiometer 48 with resistor 84. Similarly, the total feedback resistance $R_f$ is a parallel combination of the lower half of potentiometer 48 with resistor 104. With this setting of wiper arm 44, the input and feedback resistances are substantially equal and the amplifier has unity gain with respect to these high frequency signals. Variation of the setting of wiper arm 44 will vary the input and feedback resistances in a complementary manner, thus boosting the high frequency signal above unity gain when wiper arm 44 is moved upwardly, and cutting the amplification of the high frequency signals when wiper arm 44 is moved downwardly.

The amplification of low frequency signals varies substantially in the same manner as with high frequency signals, except that the combination of capacitor 114 and resistor 116 has a high impedance, the electronic inductor 118 has a low impedance, and wiper arm 46 of potentiometer 50 is variable to boost or cut the low frequency signals and potentiometer 48 is ineffective.

Tone control circuit 26 provides substantially symmetrical boost and cut of both treble (high) and bass (low) frequency signals. That is, the variation in signal amplification with respect to signal frequency at the high frequency end of the frequency spectrum is virtually the mirror image of the curve describing the variation of the same quantities at the low frequency end of the spectrum for corresponding settings of the bass and treble control potentiometers. This produces an extremely pleasing tone control effect which has been achieved in the past only by use of extremely expensive and complicated circuit arrangements.

Electronic inductor circuit 118 is highly novel and advantageous. The signal from wiper arm 46 is conducted through a relatively large coupling capacitor 120 to the junction between a capacitor 122 and a pair of bias resistors 124 and 126. The other terminal of capacitor 122 is connected between two more bias resistors 128 and 130 between which is connected a negative 15 volt DC source. Resistor 126 is connected to the emitter electrode of a common-base-connected transistor 132 whose collector is connected to input terminal 110 of the amplifier 88.

The impedance of the R–C circuit consisting of capacitor 122 and the parallel combination of resistors 128 and 130 is relatively high to low frequencies but is relatively low to high frequencies. Thus, low frequency signals are conducted through resistor 126 and the forward-biased transistor 132 to input terminal 110. The resistance of resistor 126 is relatively low, and is approximately equal to the resistance of resistor 116 in the high-pass filter network. The R–C circuit presents a lower impedance to higher frequency signals so that those signals are short-circuited and do not flow through transistor 132. Thus, the absolute magnitude of the output signal produced by electronic inductor circuit 118 varies in a manner almost identical to the variation of the impedance of an iron-core inductor. Advantageously, however, this signal is not inverted in phase as it also would not be if circuit 118 were replaced by an iron-core inductor. This feature allows simplification of the circuit connections to input terminal 110. Electronic inductor circuit 118 is considerably less expensive than an iron-core inductor, which usually must be specially wound and constructed for high-fidelity operation. Moreover, circuit 118 does not require the expensive shielding often required by such an inductor, and is considerably smaller and lighter.

As was mentioned above, tone control circuit 26 and volume control circuit 24 are interconnected in a manner such as to produce a unique interaction between the two circuits; an interaction which provides an automatic "loudness" control.

In this unique interconnection of circuits 24 and 26, the total resistance of volume control potentiometer 38 is made about half of that of resistor 84. In addition, the resistance of potentiometer 38 and the resistance of resistor 84 are very substantially greater than the resistance of either resistor 116 or 126. Thus, when bass or treble control potentiometer wiper 44 or 46 is moved to its uppermost position for maximum boost, the total input resistance input to tone control circuit 26 is quite low. As a result, the resistance between wiper 36 and the right end of volume control potentiometer 38 will constitute a significant value in relation to the tone control circuit input resistance and will increase it significantly. As the volume control wiper 36 is moved to the left to increase the output volume of the amplifier 10, the total input resistance for tone control circuit 26 is increased proportionately and the tone control circuit gain is reduced. This prevents the tone control circuit transistors from being overdriven and produces a desirable loudness "contour." The boost characteristic of both the bass and treble potentiometers is affected in this manner, but the cut characteristic is not.

The tone control circuit 26 has very little distortion and, as stated above, produces a symmetrical frequency response characteristic without the use of extremely expensive components in circuitry. As in the volume control circuit 24, there is no need for an expensive regulated power supply.

POWER AMPLIFIER 28

Power amplifier 28 is an operational amplifier; the input signal is received through an input resistor 134 and a coupling capacitor 136, and is applied to the base of a transistor 138 which forms a part of the first of three substages of amplification in power amplifier 28. A highly amplified output signal is delivered over output lead 140 which delivers the output signal through a fuse 142 to loudspeaker 30 or earphones 32. A feedback network is provided by resistors 144 and 146 with a relatively small capacitor 148 connected in parallel with the resistor 146. This network is completed by a relatively large DC blocking capacitor 150 connected to ground and a series combination of a small resistor 152 and a relatively small capacitor 154 connected between ground and output terminal 140. This network delivers a feedback signal to the input terminal 156. Capacitor 148 increases the amount of feedback produced at high frequencies, while resistor 152 and capacitor 154 serve to prevent amplifier oscillation due to high frequency signals, or with inductive loads such as loudspeaker coils, or when no load is connected to the amplifier.

The first sub-stage of amplification in amplifier 28 includes transistor 138 and its associated circuitry. Transistor 138 is operated as a common-emitter, class A amplifier by means of appropriate DC power supplies (+25 volts and −15 volts) and a bias resistor 158. In accordance with one aspect of the present invention, another transistor 160 is driven through further bias resistors 162, 164 and 166 in a common-base configuration to provide a source of constant current for transistor 138. The series combination of a resistor 168 and a small capacitor 170 is connected between the collector in base of transistor 138 to give the circuit improved high frequency stability.

The amplified output signal of transistor 138 is conducted to the second sub-stage of amplification in amplifier 28. This second sub-stage comprises a complementary-symmetry push-pull class B transistor amplifier. This amplifier consists of a NPN transistor 172 whose emitter is connected to the emitter of a PNP transistor 174 through a small resistor 176. The base electrodes of transistors 172 and 174 are connected, respectively, to the collector electrodes of transistors 160 and 138. A diode 178 is connected between the base electrodes of transistors 172 and 174 with its anode connected to the base electrode of transistor 172. The diode 178 provides a small, relatively constant forward voltage drop which serves as a bias voltage. Resistor 176 provides a high-temperature-compensating bias voltage. This second sub-stage further amplifies the signal it receives and produces a voltage-limited drive voltage for the third and last sub-stage of power stage 28.

Transistors 172 and 174 are supplied from a DC supply which is totally isolated from the power supplies for the third sub-stage of power amplifier 28. Thus, regardless of what happens to the third sub-stage, the output voltage from the second sub-stage, which is seen at point 180, never rises above about ½ of the DC supply voltage. This forms a significant part of the fail-safe burnout protection feature of amplifier stage 28.

The AC signals at point 180 are fed to the primary winding 182 of a transformer 184. DC signals cannot flow in winding 182 because of the blocking capacitor 150. Transformer 184 has two secondary windings 186 each of which drives one of a pair of identical power transistors 190 and 192. Appropriate positive and negative DC supplies are provided for power transitor 190 and 192. These power supplies are totally isolated from the power supplies for the first and second sub-stages by the transformer 184. This prevents any interaction between the power supplies and totally eliminates such interaction as a source of power transistor bunrout.

Transistors 190 and 192 are connected in a class AB push-pull connection with a double-ended input and a single-ended output at lead 140. Bias resistors 194, 196, 198 and 200 are provided. Identical emitter resistors 204 and 206 are connected in series with the emitters of transistors 190 and 192, respectively. In accordance with the present invention, the values of resistors 196 and 200, 204 and 206, and the characteristics of the transformer 184 are interrelated so that there is at all times instantaneous and fail-safe limiting of output current delivered through output lead 140, thus preventing burnout of power transistors 190 and 192.

The resistance of resistors 204 and 206 should be the same; this resistance should be at least as large as, and preferably substantially greater than the reciprocal of the high-current transconductance of transistors 190 and 192, and yet should not be large enough to cause significant loss of output signal. The resistance of resistors 196 and 200 should be the same, and this resistance should be quite low; i.e., just large enough to bias transistors 190 and 192 slightly into class AB operation so as to minimize "cross-over" signal distortion. The transformer 184 should be "tightly coupled," that is, it should have good coupling between the primary and secondary windings. Also, the transformer should have low resistances in its windings.

By making the resistance of the emitter resistors 204 and 206 substantially greater than the reciprocal of the high-current transconductance of the power transistors 190 and 192, the total imepdance of the emitter-collector path of each transistor is stabilized. The emitter resistor contributes the major portion of the total impedance of the emitter-collector path, and is not subject to drastic change at high current levels as is the transistor transconductance. The resistance of the emitter resistor should not be so high that it creates a significant loss of signal, and should not be less than the reciprocal of the transistor transconductance in order to give fail-safe control.

Following, by way of example, is one set of circuit components which has been found to meet the above requirements quite satisfactorily. The transistors 190 and 192 are No. 40051 power transistors and have a high-current transconductance of approximately 10 ohms. Resistors 204 and 206 have a resistance of 0.47 ohms, which is approximately five times greater than the reciprocal of the high current transconductance of transistors 190 and 192. The resistance of resistors 196 and 200 is 3.3 ohms. Transformer 184 is a multi-filar-wound transformer, and has 12 ohms resistance in the primary winding with 3 ohms resistance in each of the secondary windings.

With the driver voltage limited, with the power supply for the driver circuit conductively isolated from the supply for the output power transistors 190 and 192, and with the selection of limiting and bias resistors and the design of transformer as specified, the circuit 128 is securely protected from burn-out or damaging of power transistors 190 and 192 due to short-time transient overloads, or other effects which often have destroyed power transistors in prior circuits.

Protection against long-term short circuits or overloads is provided by fuse 142 which is a "slow-blow" fuse; that is, a fuse which will burn out only after an overload current has passed through it for substantial length of time. This is in contrast to fuses used in previous amplifier circuits since such prior fuses were "fast-blow" fuses which often burned out when subjected to short-time transients such as those normally encountered in the normal operation of the amplifier.

Thus, power amplifier 28 is not subject to power transistor burn-out due to extremely high frequency signals, temporary short circuits, transformer saturation or other causes. What is more, the circuit uses the highly advantageous transistor ouptut form of circuit rather than transformer or capacitor output circuits. Furthermore, the use of the operational amplifier feedback arrangement makes it possible to use unregulated, inexpensive power supplies and minimizes distortion.

The overall amplifier 10 provides many unique and highly advantageous features. None of the components of the amplifier requires a regulated power supply. This reduces the cost of the circuit substantially. Furthermore, the circuits used in eliminating this requirement use relatively inexpensive components. What is more, it is not necessary to make any time-consuming adjustments of the values of circuit components. This greatly simplifies assembly of the amplifier, makes it possible to use relatively unskilled assembly personnel and minimizes the manufacturing cost of the amplifier. Furthermore, a unique noiseless volume volume control circuit and a symmetrical tone control circuit are provided, together with an inter-connection which produces an automatic loudness control function. The amplifier has high gain and uses power transistors as output elements. The circuit provides extremely reliable burn-out protection for the power transistors.

The above description of the invention is intended to be illustrative and not limiting. Various changes or modifications in the embodiments described may occur to those skilled in the art and these can be made without departing from the spirit or scope of the invention as set forth in the claims.

I claim:

1. An electrical amplifier for amplifying electrical signals to be converted into audible sound signals, said amplifier comprising, in combination, volume control circuit means including volume amplification means, negative feedback means for varying the gain of said volume amplification means, and adjustable means forming a part of said negative feedback means for producing simultaneous complementary variation of the amount of negative feedback signal produced by said negative feedback means and the load impedance for said volume amplification means, tone control means connected to said volume control means and comprising the combination of operational amplifier means with selective bass and treble feedback means, said bass and treble feedback means being adjustable to vary the bass and treble signal outputs of said tone control means so as to produce substantially symmetrical boost and cut for both said bass and said treble signals, and relatively highpower operational amplification means connected to said tone control means, said high-power operational amplification means including a complementary-symmetry push-pull amplification stage, transformer means connected to the output of said complementary-symmetry stage and a push-pull output amplifier stage whose input is connected to and driven by the output windings of said transformer means.

2. Stereophonic electronic sound amplification means comprising two amplifiers with control means common to both of said two amplifiers, each of said amplifiers comprising a pre-amplifier stage connected to a volume control stage, which is connected to a tone control stage and thence to a power amplifier stage with means for connecting a loudspeaker to said power amplifier stage, said pre-amplifier stage having means for connecting to any one of a group of sound signal input devices, said volume control stage comprising volume amplification means, negative feedback means for varying the gain of said volume amplification means, and adjustable means forming a part of said negative feedback means for producing simultaneous complementary variation of the amount of negative feedback signal produced by said negative feedback means and the load impedance for said volume amplification means, said tone control stage comprising the combination of operational amplifier means with selective bass and treble feedback means, said bass and treble feedback means being adjustable to vary the bass and treble signal, outputs of said tone control means so as to produce substantially symmetrical boost and cut for both said bass and said treble signals, said power amplifier stage comprising an operational amplifier with a complementary-symmetry push-pull amplification stage, transformer means connected to the output of said complementary-symmetry stage and a push-pull output amplifier stage whose input is connected to and driven by the output windings of said transformer means.

3. In an electrical amplifier for amplifying electrical signals to be converted into audible sound signals, volume control circuit means including volume amplification means, negative feedback means for varying the gain of said volume amplification means, and adjustable means forming a part of said negative feedback means for producing simultaneous complementary variation of the amount of negative feedback signal produced by said negative feedback means and the load impedance for said volume amplification means, said adjustable means comprising a potentiometer having a wiper connected to one of at least two input terminals of said volume amplification means, and having one end terminal of said potentiometer connected to the output terminal of said volume amplification means, and the other end terminal connected to said negative feedback means, said negative feedback means comprising, in combination with said potentiometer, a transistor feedback amplification circuit, said circuit including a feedback transistor connected in a common-base configuration to a volume transistor in said volume amplification means, with said other end terminal of said potentiometer being connected to the base electrode of said feedback transistor.

4. Apparatus as in claim 3 in which said volume amplification transistor is connected in said volume amplification means in a common-emitter configuration, in which the base electrode of said feedback transistor is connected to the emitter-collector circuit of said volume amplification transistor, in which the collector electrode of said feedback transistor is connected to the base electrode of said volume amplification transistor, the emitter electrode of said feedback transistor being connected to the other of said input terminals, and including a capacitor having a relatively small capacitance, said capacitor being connected between the emitter and collector electrodes of said feedback transistor.

5. In an electrical amplifier for amplifying electrical signals to be converted into audible sound signals, tone control means comprising the combination of operational amplifier means with selective bass and treble feedback means, said bass and treble feedback means being adjustable to vary the bass and treble signal outputs of said tone control means so as to produce substantially symmetrical boost and cut for both said bass and said treble signals, said bass feedback means including electronic inductor circuit means having an alternating-current impedance whose absolute magnitude varies with signal frequency in substantially the same manner as the impedance of an iron-core inductor, said electronic inductor circuit comprising a transistor, means for biasing said transistor into conduction, means for feeding alternating feedback signals to said transistor, and capacitive means for by-passing said feedback signals away from said transistor in accordance with the frequency of said feedback signals.

6. Apparatus as in claim 5 in which said bass feedback means includes a series-connected potentiometer having a wiper with said electronic inductor circuit connected between said wiper and the input of said operational amplifier means, in which said treble feedback means includes a capacitor connected to said input in series with a resistor, and a series-connected potentiometer whose wiper is connected to the series combination of said resistor and capacitor, in which said operational amplifier means includes a common-emitter transistor amplification stage connected in cascade with a common-collector transistor amplification stage, positive feed means connected between the emitter of said common-collector transistor and the collector of said common-emitter transistor, and high-frequency selective feedback means connected between said emitter and through an impedance to said collector, and including an input resistor connected to said input of said operational amplifier, one end of each of said potentiometers being connected to said input resistor and the other end to the output of said operational amplifier.

7. An electrical amplifier for amplifying electrical signals to be converted into audible sound signals, said amplifier comprising, in combination, volume control means and tone control means connected to power amplification means, said power amplification means comprising a voltage-limited driver amplifier, transformer means driven by said driver amplifier, a pair of push-pull-connected power transistors driven by said transformer means, and a pair of impedance elements each connected into the emitter-collector path of one of said transistors, the impedance of each of said impedance elements being at least equal to the reciprocal of the high-current transconductance of the power transistor to which it is connected.

8. An electrical amplifier for amplifying electrical signals to be converted into audible sound signals, said amplifier comprising, in combination, volume control means and tone control means connected to power amplification means, said power amplification means comprising a complementary-symmetry push-pull amplification stage, transformer means connected to the output of said complementary-symmetry stage, means for limiting the output voltage of said complementary-symmetry stage, first bias means for providing a DC bias signal for said complementary-symmetry stage, a pair of push-pull-connected power transistors driven by said transformer means, and a pair of impedance elements each connected into the emitter-collector path of one of said transistors, the impedance of each of said impedance elements being at least equal to the reciprocal of the high-current transconductance of the power transistor to which it is connected, an output terminal to be connected to audio sound reproducing equipment, a fuse connected between said terminal and the common output point between said power transistors, said fuse being characterized by the fact that it opens the circuit into which it is connected only in response to an overload signal of a time duration substantially longer than the duration of the normal peak audio signals to be passed through said fuse, input impedance means for said power amplification means, and feedback means for feeding a part of the output signal from said amplifier means to the junction between said input impedance and the input terminal of said power amplification means.

9. An electrical amplifier for amplifying electrical signals to be converted into audible sound signals, said amplifier comprising, in combination, volume control circuit means including volume amplification means, negative feedback means for varying the gain of said volume amplification means, and adjustable means forming a part of said negative feedback means for producing simultaneous complementary variation of the amount of negative feedback signal produced by said negative feedback means and the load impedance for said volume amplification means, tone control amplifier means including frequency-selective means for selectively varying the increase and decrease in amplification of bass and treble signals by said tone control amplifier means, said frequency-selective means being characterized by the fact that its use in increasing the amplification of either bass or treble signals decreases the effective input impedance of said tone control amplifier means, said adjustable means in said volume amplification means being characterized by the fact that when it is adjusted to increase the gain of said volume amplification means it simultaneously increases the input impedance of said tone control amplifier means.

References Cited

UNITED STATES PATENTS

| | | | |
|---|---|---|---|
| 2,361,602 | 10/1944 | Clark | 325—424 |
| 2,983,795 | 5/1961 | Tateishi et al. | 179—100.11 |

ROY LAKE, *Primary Examiner.*

L. J. DAHL, *Assistant Examiner.*

UNITED STATES PATENT OFFICE
CERTIFICATE OF CORRECTION

Patent No. 3,414,830 December 3, 1968

George A. Hellwarth

It is certified that error appears in the above identified patent and that said Letters Patent are hereby corrected as shown below:

Column 12, after line 15, insert claims 10 and 11 as follow

10. An amplifier as in claim 7 which includes an output terminal for said amplifier, and a fuse connected between said output terminal and the common output point between said power transistors, said fuse being characterized by the fact that it opens the circuit into which it is connected only in response to an overload signal of a time duration substantially longer than the duration of the normal peak audio signals to be passed through said fuse.

11. An amplifier as in claim 10 in which each of said impedance elements is an emitter resistor with one terminal connected to the emitter of one of said power transistors, said transformer means comprising a transformer with two secondary windings, one terminal of each of said secondary windings being connected to the base lead of one of said power transistors, a pair of base-bias resistors, each of said base-bias resistors being connected between the other terminal of one of said secondary windings and the other terminal of one of said emitter resistors.

In the heading to the printed specification, line 6, "9 Claims" should read -- 11 Claims --.

Signed and sealed this 10th day of March 1970.

(SEAL)
Attest:

EDWARD M.FLETCHER,JR.
Attesting Officer

WILLIAM E. SCHUYLER, JR.
Commissioner of Patents